(12) United States Patent
Kazama

(10) Patent No.: US 11,003,577 B2
(45) Date of Patent: May 11, 2021

(54) INFORMATION PROCESSING APPARATUS, INFORMATION PROCESSING METHOD, AND NON-TRANSITORY COMPUTER-READABLE STORAGE MEDIUM FOR STORING PROGRAM OF ACCESS CONTROL WITH RESPECT TO SEMICONDUCTOR DEVICE MEMORY

(71) Applicant: FUJITSU LIMITED, Kawasaki (JP)

(72) Inventor: Satoshi Kazama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/445,270

(22) Filed: Jun. 19, 2019

(65) Prior Publication Data
US 2019/0303287 A1    Oct. 3, 2019

Related U.S. Application Data

(63) Continuation of application No. PCT/JP2018/000743, filed on Jan. 15, 2018.

(30) Foreign Application Priority Data

Jan. 24, 2017 (JP) .............................. JP2017-009931

(51) Int. Cl.
  *G06F 12/00* (2006.01)
  *G06F 12/02* (2006.01)
  (Continued)

(52) U.S. Cl.
  CPC .......... *G06F 12/0246* (2013.01); *G06F 12/00* (2013.01); *G06F 12/02* (2013.01);
  (Continued)

(58) Field of Classification Search
  CPC .. G06F 12/0246; G06F 12/08; G06F 12/0804; G06F 12/0868; G06F 12/02;
  (Continued)

(56) References Cited

U.S. PATENT DOCUMENTS

| 2005/0182893 A1 | 8/2005 | Suh |
| 2006/0013048 A1 | 1/2006 | Kim |

(Continued)

FOREIGN PATENT DOCUMENTS

| JP | 2002-269992 | 9/2002 |
| JP | 2005-235182 | 9/2005 |

(Continued)

OTHER PUBLICATIONS

International Search Report and Written Opinion of the International Searching Authority, mailed in connection with PCT/JP2018/000743 and dated Feb. 13, 2018 (12 pages).

(Continued)

*Primary Examiner* — Mardochee Chery
(74) *Attorney, Agent, or Firm* — Fujitsu Patent Center

(57) ABSTRACT

An information processing apparatus includes: a first memory including a semiconductor device memory; a second memory including a cache memory, the second memory being configured to temporarily store data to be written in the semiconductor device memory; and a processor configured to execute a writing-back process that includes providing a notification regarding completion of writing of the data before the data stored in the second memory is written in the first memory, execute an alternative writing process that includes writing the data at a second physical address in the first memory when writing of the data at a first physical address in the first memory is failed, and execute an access process that includes accessing the data written at the second physical address based on address management information, the address management information indicating a correspondence between the first physical address and the second physical address.

9 Claims, 11 Drawing Sheets

(51) Int. Cl.
*G06F 12/0877* (2016.01)
*G06F 12/0893* (2016.01)
*G06F 12/08* (2016.01)
*G06F 12/0804* (2016.01)
*G06F 12/0868* (2016.01)
*G11C 29/00* (2006.01)

(52) U.S. Cl.
CPC .......... *G06F 12/08* (2013.01); *G06F 12/0804* (2013.01); *G06F 12/0868* (2013.01); *G06F 12/0877* (2013.01); *G06F 12/0893* (2013.01); *G11C 29/00* (2013.01)

(58) Field of Classification Search
CPC .. G06F 12/00; G06F 12/0877; G06F 12/0893; G06F 2212/7201; G06F 2212/7202; G11C 29/00
USPC ......................................................... 711/165
See application file for complete search history.

(56) References Cited

U.S. PATENT DOCUMENTS

2012/0191900 A1* 7/2012 Kunimatsu ........... G06F 3/0653
 711/103
2012/0215964 A1  8/2012 Kaneko et al.

FOREIGN PATENT DOCUMENTS

| JP | 2006-31696 | 2/2006 |
| JP | 2010-198368 | 9/2010 |
| JP | 2012-173778 | 9/2012 |
| JP | 2014-106718 | 6/2014 |

OTHER PUBLICATIONS

Japanese Office Action dated Dec. 8, 2020 for corresponding Japanese Patent Application No. 2017-009931, with English Translation, 9 pages.

* cited by examiner

INFORMATION PROCESSING APPARATUS, INFORMATION PROCESSING METHOD, AND NON-TRANSITORY COMPUTER-READABLE STORAGE MEDIUM FOR STORING PROGRAM OF ACCESS CONTROL WITH RESPECT TO SEMICONDUCTOR DEVICE MEMORY

CROSS-REFERENCE TO RELATED APPLICATION

This application is a continuation application of International Application PCT/JP2018/000743 filed on Jan. 15, 2018 and designated the U.S., the entire contents of which are incorporated herein by reference. The International Application PCT/JP2018/000743 is based upon and claims the benefit of priority of the prior Japanese Patent Application No. 2017-009931, filed on Jan. 24, 2017, the entire contents of which are incorporated herein by reference.

FIELD

The embodiment discussed herein is related to an information processing apparatus, an information processing method, and a non-transitory computer-readable storage medium for storing a program.

BACKGROUND

FIG. 10 is a diagram schematically illustrating a functional configuration for controlling a solid state drive (SSD).

An SSD control system 500 illustrated in FIG. 10 includes an SSD 510, a disc driver 504, a file system 505, and an application 506.

The application 506 is a program utilized by a user and realizes a variety of functions. Data and the like generated by the application 506 are stored in a storage region of a flash memory 501 of the SSD 510. In response to a reading request from the application 506, the data is read from the storage region of the SSD 510.

The file system 505 is adapted to control operations, accesses, and retrieval of data, causes the SSD 510 to store data provided by the application 506 as a file, or causes data to be read from the SSD 510.

The disc driver 504 communicates with the SSD 510 and transmits and receives commands and data to and from the SSD 510.

The SSD 510 includes a flash memory control unit 502, an interface unit 503, and a plurality of flash memories 501 as illustrated in FIG. 10.

The flash memory 501 is a semiconductor storage element and stores data such that the data may be freely read. The interface unit 503 receives a command or data transmitted from the disc driver 504 and transmits data to the disc driver 504.

The flash memory control unit 502 accesses the storage region of the flash memory 501 and stores and reads data. For example, the flash memory control unit 502 designates a physical address of the flash memory 501 and read data therefrom or write data therein.

Functions of the application 506, the file system 505, and the disc driver 504 are realized by a central processing unit (CPU) of a computer, which is not illustrated, executing software.

The interface unit 503 and the flash memory control unit 502 are implemented by hardware of the SSD 510.

In recent years, a software control-type SSD in which functions of the flash memory control unit 502, which is mounted by hardware in such an SSD control system, is implemented by software such that the flash memory 501 may be controlled directly from the software has been proposed.

FIG. 11 is a diagram illustrating a configuration of the software control-type SSD.

In the example illustrated in FIG. 11, the SSD 510 includes the flash interface unit 503 and the plurality of flash memories 501.

In the software control-type SSD, a flash memory control unit 502a that realizes functions that are similar to those of the flash memory control unit 502 illustrated in FIG. 10 is implemented as a software module in flash memory control software 507.

An application 506a may designate a physical address of the flash memory 501 directly from the side of the software using the functions of the flash memory control unit 502a provided in the flash memory control software 507.

The application 506a may thus finely control reading and writing of data with respect to the flash memory 501 and may perform a data access to the flash memory 501 in an optimized manner in accordance with the application 506a.

For example, since it takes about 1 to 2 msec to write data in the flash memory, a processing speed decreases if writing (programming) in the flash memory is performed every time a writing operation is received in the SSD.

Therefore, the SSD in the related art includes a writing buffer (not illustrated) such as a dual inline memory module (DIMM) and stores writing data received along with a writing operation once in the writing buffer. At a timing at which the writing data is stored in the writing buffer, a so-called writing-back process in which a response with a commit indicating the completion of the writing is provided to a transmission source of a writing request and writing in the flash memory is performed in the background is performed. Note that the "writing-back process" is also referred to as a "writing turning-down process".

Examples of the related art include Japanese Laid-open Patent Publication Nos. 2012-173778, 2006-31696, and 2005-235182.

SUMMARY

According to an aspect of the embodiments, an information processing apparatus includes: a first memory including a semiconductor device memory; a second memory including a cache memory, the second memory being configured to temporarily store writing data to be written in the semiconductor device memory; and a processor configured to execute an access control process that controls an access to a storage region of the semiconductor device memory, wherein the access control process includes executing a writing-back process that includes providing a notification regarding completion of writing of the writing data before the writing data stored in the second memory is written in the first memory, executing an alternative writing process that includes writing the writing data at a second physical address in the first memory when writing of the writing data at a first physical address in the first memory is failed, and executing an access process that includes accessing the writing data written at the second physical address based on address management information, the address management information indicating a correspondence between the first physical address and the second physical address.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
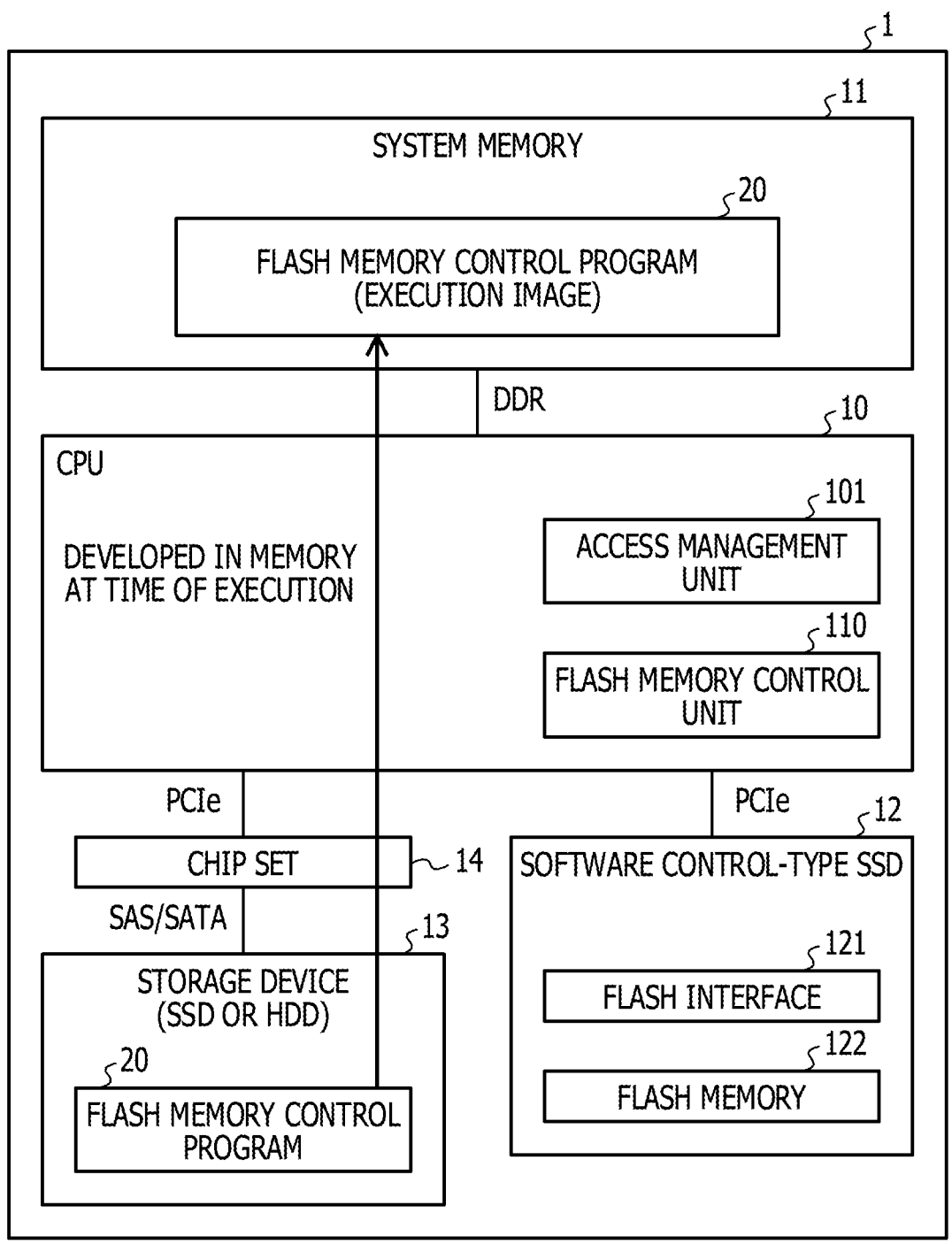
FIG. 1 is a diagram illustrating an exemplary hardware configuration of a computer system in an example of a first embodiment.

As described above, it is possible to directly designate the physical address of the flash memory 501 from the application 506a using the flash memory control unit 502a, which is executed as software, in the software control-type SSD.

In the writing-back process, a commit is returned to the software 506a before physical writing is performed on the flash memory 501 of the SSD 510a after the writing data is written in the writing buffer.

Here, when writing data is attempted to be written in the flash memory 501 and the writing is failed for some reason, writing is performed again at another physical address in the flash memory 501.

In this case, the address at which the writing data is actually written in the flash memory 501 is different from an address, writing at which is designated by the application 506a, from which the response with the commit is provided, and inconformity occurs.

When the application 506a attempts to read the writing data from the flash memory 501 thereafter, the application 506a may designate the address from which writing has been failed, at which no writing data has actually been stored, and transmits a reading request thereto, and there is thus a problem that correct data may not be read from the flash memory 501.

In one aspect, an object of the embodiments is to enable minimization of occurrence of address inconformity when the writing-back process is executed in the software control-type SSD.

Hereinafter, embodiments of the information processing apparatus, the control program, and the information processing method will be described with reference to drawings. The embodiments described below are just examples and are not intended to exclude various modifications and applications of the technologies that will be not explicitly described in the embodiments. For example, the embodiments may be performed by being modified in various manners without departing from the gist thereof. The respective drawings are not intended to indicate that only components illustrated in the drawings are included and may include other functions and the like.

(I) Description of First Embodiment (A) Configuration

FIG. 1 is a diagram illustrating an exemplary hardware configuration of a computer system in an example of a first embodiment.

A computer system 1 is an information processing apparatus provided with a server function and includes a CPU 10, a system memory 11, an SSD 12, a chip set 14, and a storage device 13 as illustrated in FIG. 1.

The storage device 13 is a storage device such as a hard disk drive (HDD), an SSD, or a storage class memory (SCM), includes a storage medium, and stores various kinds of data.

The storage device 13 is used as an auxiliary storage device of the computer system 1 and is used as a secondary storage device in the computer system 1.

The storage device 13 is a computer-readable non-transitory recording medium and stores an operating system (OS), an application program, and various kinds of data. The application program includes flash memory control software (control program) 20.

The chip set 14 is obtained by integrating a bus bridge function of connecting the CPU 10 to the storage device 13, for example.

The system memory 11 is used as a main storage device of the computer system 1. At least a part of the OS and the application program (flash memory control program 20) to be executed by the CPU 10 is temporarily stored as an execution image in the system memory 11. Various kinds of data that may be used by the CPU 10 for processes is also stored in the system memory 11.

The application program on the system memory 11 is appropriately read and executed by the CPU 10. The system memory 11 is used as a primary storage memory or a working memory.

A part of the storage region of the system memory 11 is used as the writing buffer 15 that temporarily stores the writing data to be written in the SSD 12. The writing buffer 15 functions as a cache memory that stores the writing data once before writing the writing data in the SSD 12.

The SSD 12 is a storage device using a semiconductor device memory as a storage medium. The SSD 12 includes a flash interface 121 and a flash memory 122 as illustrated in FIG. 1.

The SSD 12 is an SSD of a software control type, and the SSD 12 itself does not include functions of a flash memory control unit that controls an access to the flash memory 122. For example, the access to the flash memory 122 is controlled by a flash memory control unit 110 that is executed by the CPU 10 mounted outside the SSD 12.

The flash memory 122 is a semiconductor storage device and stores data in a freely readable manner. The flash interface 121 receives a command and data transmitted from the CPU 10 (flash memory control unit 110) and transmits data and the like to the CPU 10 (flash memory control unit 110).

Figure 2:
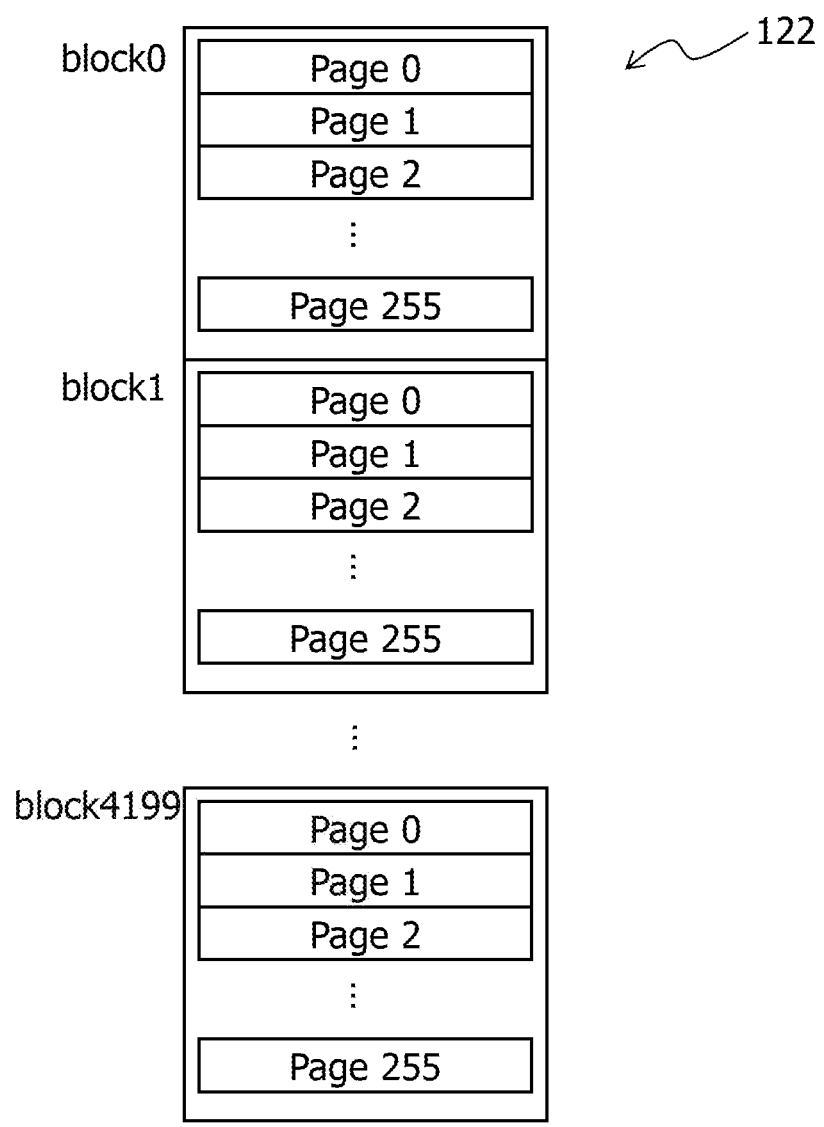
FIG. 2 is a diagram illustrating an exemplary configuration of a storage region of a flash memory illustrated in FIG. 1.

FIG. 2 is a diagram illustrating an exemplary configuration of the storage region of the flash memory 122 illustrated in FIG. 1.

The storage region of the flash memory 122 is configured of blocks and pages as illustrated in FIG. 2.

The storage region of the flash memory 122 illustrated as an example in FIG. 2 includes 4200 blocks (block0 to block4199), and 256 pages (page0 to page255) are formed in each of the blocks. Each page has a storage capacity of 16 KB (KiloByte).

Operations performed on the flash memory 122 includes "read", "program", and "erase", and these operations (requests) are issued from the flash memory control unit 110, which will be described later.

Here, "read" is used for reading data from the flash memory 122 and is executed in units of pages.

"Erase" is used to delete data from the flash memory 122 and is executed in units of blocks.

"Program" is used to write data in the flash memory 122 and is executed in units of pages. Flash memory 122 realizes the Data rewriting by executing "erase" first to delete data and then performing a program rather than an operation of realizing rewriting of the data at once in the storage region in which data has already been stored. Hereinafter, the program may also be referred to as writing.

As described above, although "erase" may be executed in units of blocks, it is difficult to execute it in units of pages. "Read" and "program" may be executed in units of pages.

The flash memory control unit 110, which will be described later, realizes reading and writing with respect to the flash memory 122 by designating a block and a page in the flash memory 122 and transmitting (providing a notification) each operation of "read", "program", and "erase" to the SSD 12.

The CPU 10 is a processing device that performs various kinds of control and computation and realizes various functions by executing the OS and the program stored in the system memory 11. For example, the CPU 10 realizes functions of the access management unit 101 and the flash memory control unit 110 as illustrated in FIG. 1 by executing the flash memory control program (control program) 20.

The program (flash memory control program) for realizing the functions of the access management unit 101 and the flash memory control unit 110 is provided in such a form that the program is recorded in a computer-readable recording medium such as a flexible disc, a CD (such as a CD-ROM, a CD-R, or a CD-RW), a DVD (such as a DVD-ROM, a DVD-RAM, a DVD-R, a DVD+R, DVD-RW, a DVD+RW, or an HD DVD), a blu-ray disc, a magnetic disk, an optical disc, or a magneto-optical disc. The computer reads the program from the recording medium, transfers the program to an internal storage device or an external storage device, stores the program therein, and use the program. The program may be recorded in a storage device (recording medium) such as a magnetic disk, an optical disc, or a magneto-optical disc and may be provided to the computer from the storage device via a communication route.

To realize the functions of the access management unit 101 and the flash memory control unit 110, the program stored in the internal storage device (the system memory 11 in the embodiment) is executed by a microprocessor (the CPU 10 in the embodiment) of the computer. At this time, the program recorded in the recording medium may be read and executed by the computer.

Figure 3:
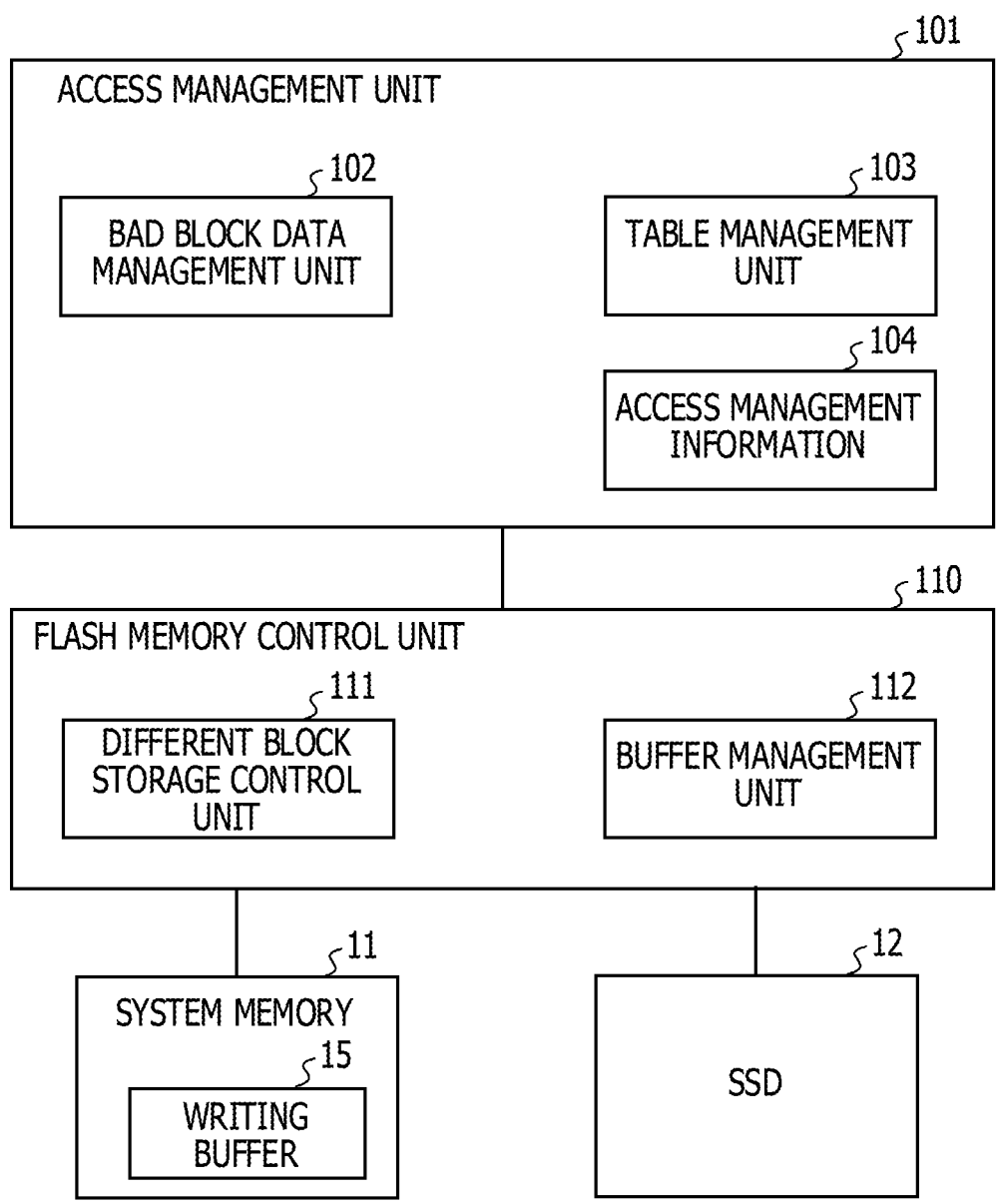
FIG. 3 is a diagram illustrating each of functional configurations of an access management unit and a flash memory control unit in the computer system in an example of the first embodiment.

FIG. 3 is a diagram illustrating the respective functional configurations of the access management unit 101 and the flash memory control unit 110 in the computer system 1 as an example of the first embodiment.

The flash memory control unit 110 controls writing and reading of data with respect to the SSD 12.

The flash memory control unit 110 realizes reading and writing with respect to the flash memory 122 by designating a block and a page in the flash memory 122 and providing a notification regarding an operation of "read", "program", or "erase" or a combination thereof to the SSD 12 and the system memory 11 (writing buffer 15).

For example, the control of the direct access to the block and the page in the flash memory 122 is realized by the CPU 10 executing the flash memory control program 20 in the computer system 1, without using functions of the SSD 12.

The flash memory control unit 110 includes functions of a different block storage control unit 111 and a buffer management unit 112 as illustrated in FIG. 3.

The buffer management unit 112 causes the writing buffer 15 of the system memory 11 to store the writing data to be stored in the SSD 12 (flash memory 122) when the buffer management unit 112 attempts to write the data in the SSD 12).

The flash memory control unit 110 causes the writing buffer 15 of the system memory 11 to store the writing data when the flash memory control unit 110 writes the data (writing data) in the flash memory 122 of the SSD 12. The flash memory control unit 110 then provides a notification regarding a commit (writing completion notification) indicating that the writing of the writing data in the SSD 12 has been completed) to the access management unit 101 or a higher-order device, which is not illustrated in the drawing, at a timing at which the writing data is stored in the writing buffer 15.

Then, the flash memory control unit 110 causes data in the writing buffer 15, for which the notification regarding the commit has been provided, to be stored in the background in the storage region of the flash memory 122 of the SSD 12 in a state in which loads on the flash memory control unit 110 and the SSD 12 are low, for example.

For example, the flash memory control unit 110 performs a writing-back process (writing turning-down process) of providing a notification regarding completion of the writing of the writing data (commit) before the writing data is written in the flash memory 122 after the writing data is stored in the writing buffer (cache memory) 15. For example, the flash memory control unit 110 functions as a writing-back process unit.

The buffer management unit (cache deletion processing unit) 112 performs a process of deleting writing data, which has completely been written in the flash memory 122, from the writing buffer 15. The buffer management unit 112 performs the deletion of the data from the writing buffer 15 after the process of the bad block data management unit 102, which will be described later, moving the data stored in pages other than a bad page in a bad block to another block from which no abnormality has been detected.

The different block storage control unit 111 designate another block (alternative block) in the SSD 12 and causes the processes of "read", "program", and "erase" to be executed again when any of the processes of "read", "program", and "erase" that has been performed along with the designation of the block and the page of the flash memory 122 has been failed.

When data D is attempted to be written in a specific page in a block A in the SSD 12 (flash memory 122) (for example, page a: Block a, page a) and writing in this page is not achieved for some reason, the different block storage control unit 111 selects a storage region (for example, Block B, page b) of another block that is different from the block A (for example, Block B: alternative block) as a destination of writing of the data D.

For example, when it is difficult to execute writing (programming) of data in a designated region (first physical address) in the SSD 12, the different block storage control unit 111 performs alternative region selection of selecting another region (block: second physical address, alternative block, alternative storage region). Then, the different block storage control unit 111 performs an alternative writing process of causing the writing data D to be stored in this newly selected alternative storage region.

Therefore, the different block storage control unit 111 functions as an alternative writing process unit of writing the writing data at the second physical address in the flash memory 122 when the writing of the writing data at the first physical address in the flash memory 122 is failed.

Hereinafter, the storage region in which writing has not been achieved in the SSD 12 (flash memory 122) in the selection of the alternative region will also be referred to as a bad storage region. In particular, the block in which the writing has not been achieved will also be referred to as a bad block, and the page in which the writing has not been achieved in the bad block will also be referred to as a bad page.

The storage region that the different block storage control unit 111 has selected as a destination of the storage of the writing data instead of the bad block will also be referred to as an alternative storage region, and in particular, the block selected as the alternative region will also be referred to as an alternative block.

The different block storage control unit 111 provides a notification regarding the bad storage region and the alternative storage region to the access management unit 101 when the selection of the alternative region is performed.

The access management unit 101 manages the address of the region in which data is stored in the SSD 12.

The access management unit 101 functions as a bad block data management unit 102 and a table management unit 103 as illustrated in FIG. 3.

The table management unit 103 manages access management information 104. The table management unit 103 creates and updates the access management information 104.

The access management information 104 is information used to access data in the storage region of the SSD 12 and is for managing a recording position of the data in the SSD 12. In the access management information 104, information indicating content of the stored data is registered in association with information indicating the position of the storage region in the SSD 12, for example.

Also, the access management information 104 includes address conversion information configured such that the bad storage region and the alternative storage region provided through the notification from the different block storage control unit 111. Hereinafter, the address conversion information in the access management information 104 will also be referred to as an address conversion table 104a.

The access management information 104 is stored in a predetermined region in the system memory 11 or the storage device 13, for example.

The bad block data management unit 102 moves the data stored in the bad block in the SSD 12 to a different block other than the bad block in the SSD 12. For example, the bad block data management unit 102 moves the data (effective data) that is stored in a page other than the bad page in the bad block to another block (normal block) from which no abnormality has been detected.

There is a concern that it is also difficult to read and write data with respect to the bad block in the future in pages other than the bad page. Thus, it is possible to protect effective data by moving the data that is effective (effective data) and is stored in the bad block to another block from which no abnormality has been detected.

The bad block data management unit 102 may select the alternative block as a block of a destination of the moving of the data (effective data) stored in the pages other than the bad page in the bad block. In this manner, it is possible to cause the alternative block to have a data configuration that is similar to that before the selection of the alternative region is performed, and high convenience is achieved.

When it is attempted to perform reading access to the SSD 12, the access management unit 101 refers to the access management information 104 (address conversion table 104a). When a page as a target of the reading access is registered as a bad page in the address conversion table 104a, an alternative page corresponding to the bad page is acquired from the address conversion table 104a, and the reading access is then performed on the alternative page.

(B) Operations

Figure 4:
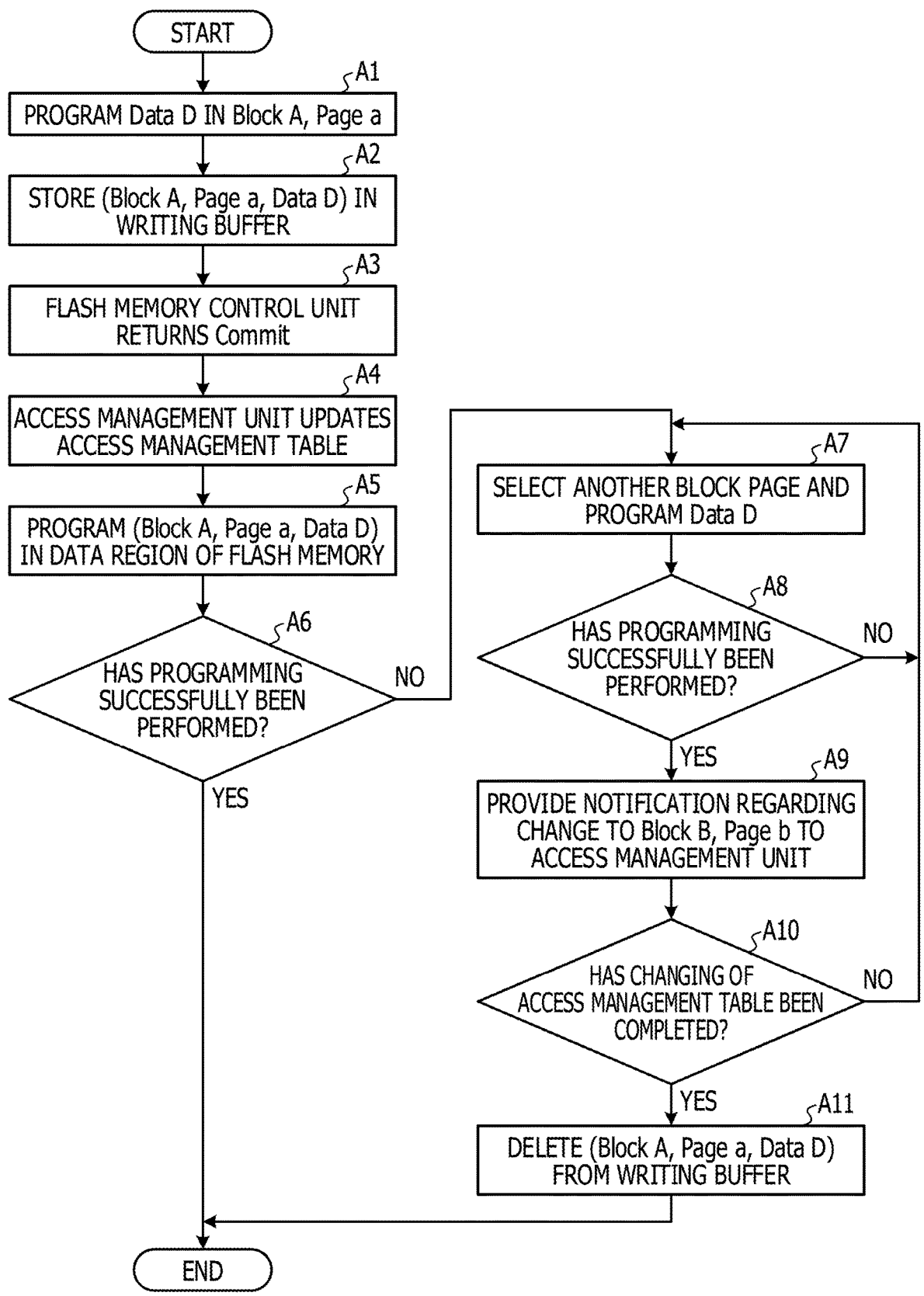
FIG. 4 is a flowchart for explaining a writing (programming) process performed in the computer system in an example of the first embodiment.
Figure 5:
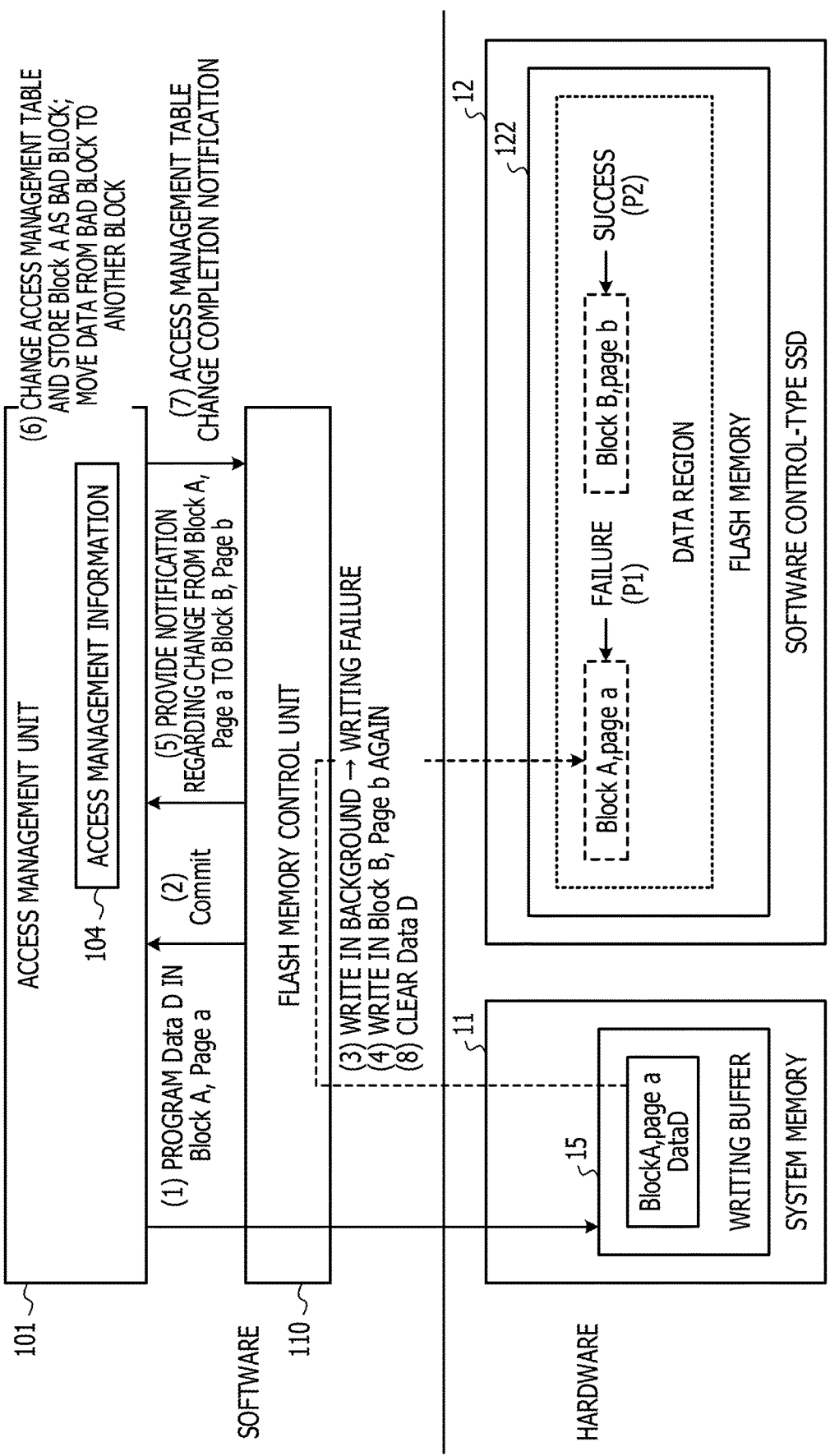
FIG. 5 is a diagram for explaining a writing (programming) process performed in the computer system in an example of the first embodiment.

The writing (programming) process performed in the computer system 1 in one example of the first embodiment will be described based on the flowchart (Steps A1 to A11) illustrated in FIG. 4 with reference to FIG. 5. FIG. 5 is a diagram illustrating the writing (programming) process performed in the computer system 1 in one example of the first embodiment.

In the example described below, an example in which an operation of programming data "D" (data D) in a storage region "Block A, page a" is assumed to have been issued from an application executed by the CPU 10, for example, will be described.

In Step A1, an operation of programming data "D" (data D) in the storage region "Block A, page a" is issued.

In Step A2, the access management unit 101 causes the writing buffer 15 in the system memory 11 to store a program operation "Block A, page a, data D" (see the arrow (1) in FIG. 5).

In Step A3, the flash memory control unit 110 responds to the access management unit 101 with a commit (see the arrow (2) in FIG. 5).

In Step A4, the access management unit 101 updates access management information (access management table) 104. For example, the access management unit 101 registers, in the access management information 104, information indicating that the data "D" (data D) has been programmed in the storage region "Block A, page a" in the SSD 12.

In Step A5, the flash memory control unit 110 programs the data "D" (data D) in the storage region "Block A, page a" in the flash memory 122 of the SSD 12 in the background.

In Step A6, the flash memory control unit 110 checks whether or not the programming performed in Step A5 has been successfully performed. When the programming has been successfully performed as a result of the checking (see the YES route from Step A6), the process is ended.

Meanwhile, in a case in which the programming performed in Step A5 has been failed (see the NO route from Step A6), the process proceeds to Step A7 (see the arrow (3) and (P1) in FIG. 5).

In Step A7, the flash memory control unit 110 selects a page (alternative storage region: a storage region "Block B, page b" in this example) in another block (alternative block) that is different from the block (bad block) in which the programming has been failed (see the arrow P2 in FIG. 5). The flash memory control unit 110 programs the data "D" in the alternative storage region.

In Step A8, the flash memory control unit 110 checks whether or not the programming performed in Step A7 has been successfully performed. When the programming has been failed as a result of the checking (see the NO route from Step A8), the process returns to Step A7, the selection of an alternative storage region and the programming of the data "D" are executed again (see the arrow (4) in FIG. 5).

Meanwhile, when the programming performed in Step A7 has been successfully performed (see the YES route from Step A8), the process proceeds to Step A9.

In Step A9, the flash memory control unit 110 provides a notification (change notification) regarding the event that the destination of the programming of the data "D" has been changed from the storage region "Block A, page a" to the storage region "Block B, page b" to the access management unit 101 (see the arrow (5) in FIG. 5). The flash memory control unit 110 provides a notification regarding the bad block (Block A) and the alternative block (Block B) to the access management unit 101.

The access management unit 101 updates the access management information 104 (address conversion table 104a) based on the received change notification (the bad block and the alternative block). The access management unit 101 registers Block A as a bad block and registers Block B in association with Block A in the address conversion table 104a (see the arrow (6) in FIG. 5).

When the updating of the access management information 104 is completed, the access management unit 101 provides a notification (address conversion table change completion notification) to the flash memory control unit 110 (see the arrow (7) in FIG. 5).

In Step A10, the flash memory control unit 110 checks whether or not updating of the access management information 104 performed by the access management unit 101 has been completed. When the updating of the access management information 104 has not been completed as a result of the checking (see the NO route from Step A10), the process returns to Step A7.

Meanwhile, when the updating of the access management information 104 has been completed as a result of the checking in Step A10 (see the YES route from Step A10), the process proceeds to Step A11.

In Step A11, the flash memory control unit 110 deletes (clears) the programming operation "Block A, page a, data D" in the writing buffer 15 (see the arrow (8) in FIG. 5), and the process is ended.

Figure 6:
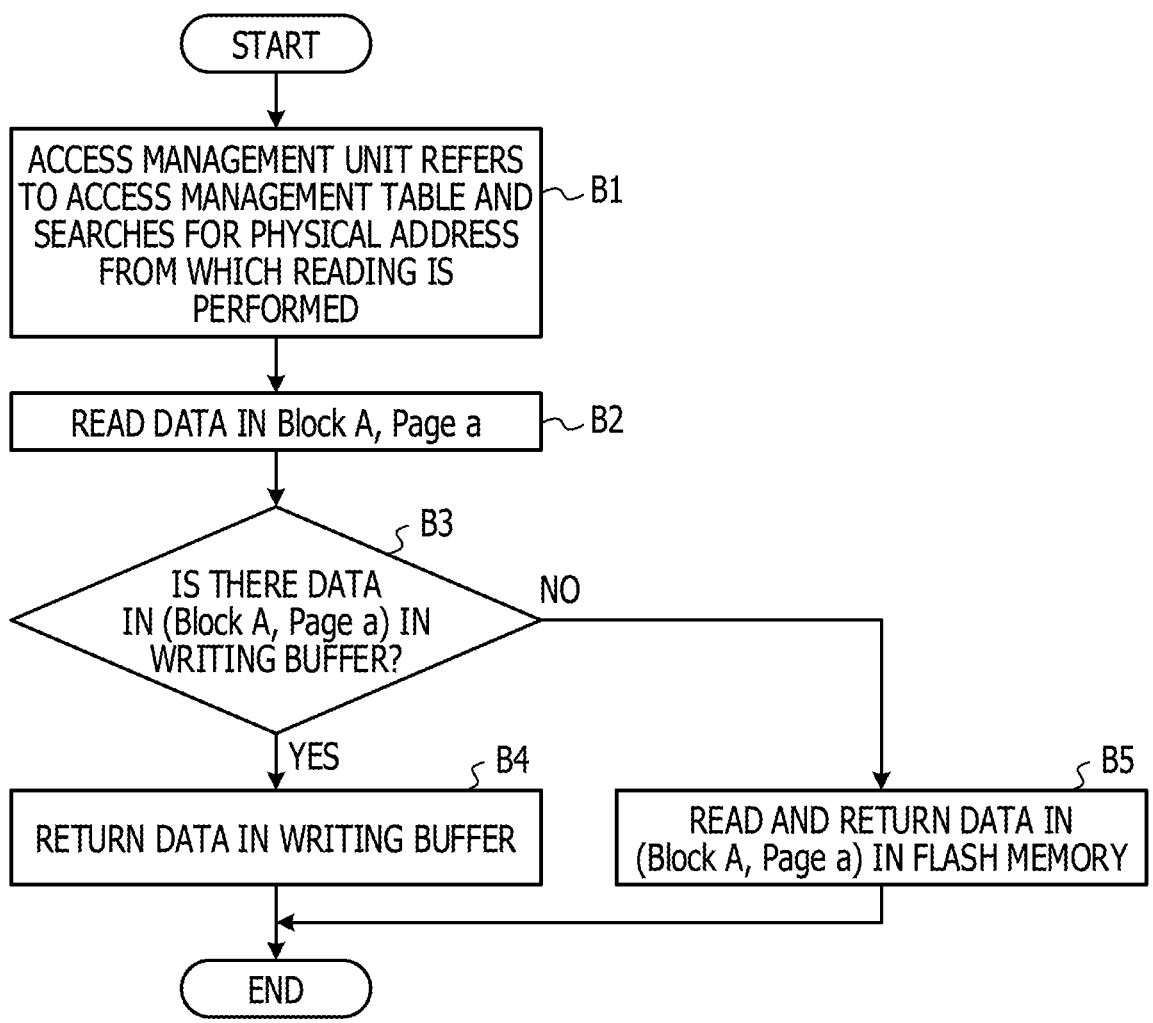
FIG. 6 is a flowchart for explaining a reading (read) process performed in the computer system in an example of the first embodiment.

Next, a reading (read) process performed in the computer system 1 in one example of the first embodiment will be described based on the flow chart (Steps B1 to B5) illustrated in FIG. 6.

In the example described below, an example in which an operation of reading data in a storage region "Block A, page a" is assumed to have been issued from an application that is executed by the CPU 10, for example, will be described.

In Step B1, the access management unit 101 refers to the access management information 104 and searches for a physical address from which reading is to be performed.

In Step B2, the access management unit 101 executes reading of the data in "Block A, page a".

In Step B3, the flash memory control unit 110 checks whether or not data in "Block A, page a" that is a reading target area is stored in the writing buffer 15. When the data in "Block A, page a" is stored in the writing buffer 15 as a result of the checking (see the YES route from Step B3), the process proceeds to Step B4.

In Step B4, the flash memory control unit 110 reads the data in "Block A, page a" stored in the writing buffer 15, responds to the access management unit 101, and ends the process.

When the data in "Block A, page a" that is a reading target region is not stored in the writing buffer 15 as a result of the checking in Step B3 (see the NO route from Step B3), the process proceeds to Step B5.

In Step B5, the flash memory control unit 110 reads the data in the storage region "Block A, page a" in the flash memory 122 of the SSD 12, responds to the access management unit 101, and ends the processing.

(C) Effects

According to the computer system 1 in the first embodiment, it is possible to solve inconformity of a programming destination using the access management information 104 (address conversion table 104a) even when it is attempted to perform the writing-back process in the software control-type SSD 12, execution of programming of data in a designated storage region is failed, and the programming is executed on a substitute storage region. Thus, it is possible to read data programmed in the substitute storage region by referring to the address conversion table 104a in a reading access performed thereafter.

Thus, it is possible to apply the writing-back process without causing any inconformity and to improve writing (programming) processing performance in the SSD 12 according to the software control-type SSD 12.

Also, in a case in which it is difficult to execute writing (programming) of data in the designated region in the SSD 12, the bad block data management unit 102 moves the data stored in the bad block in the SSD 12 to a different block other than the bad block in the SSD 12. For example, the bad block data management unit 102 moves the data (effective data) stored in a page other than the bad page in the bad block to another block (normal block) from which no abnormality has been detected. In this manner, it is possible to protect the effective data stored in the bad block and to improve reliability.

(II) Description of Second Embodiment (A) Configuration

Figure 7:
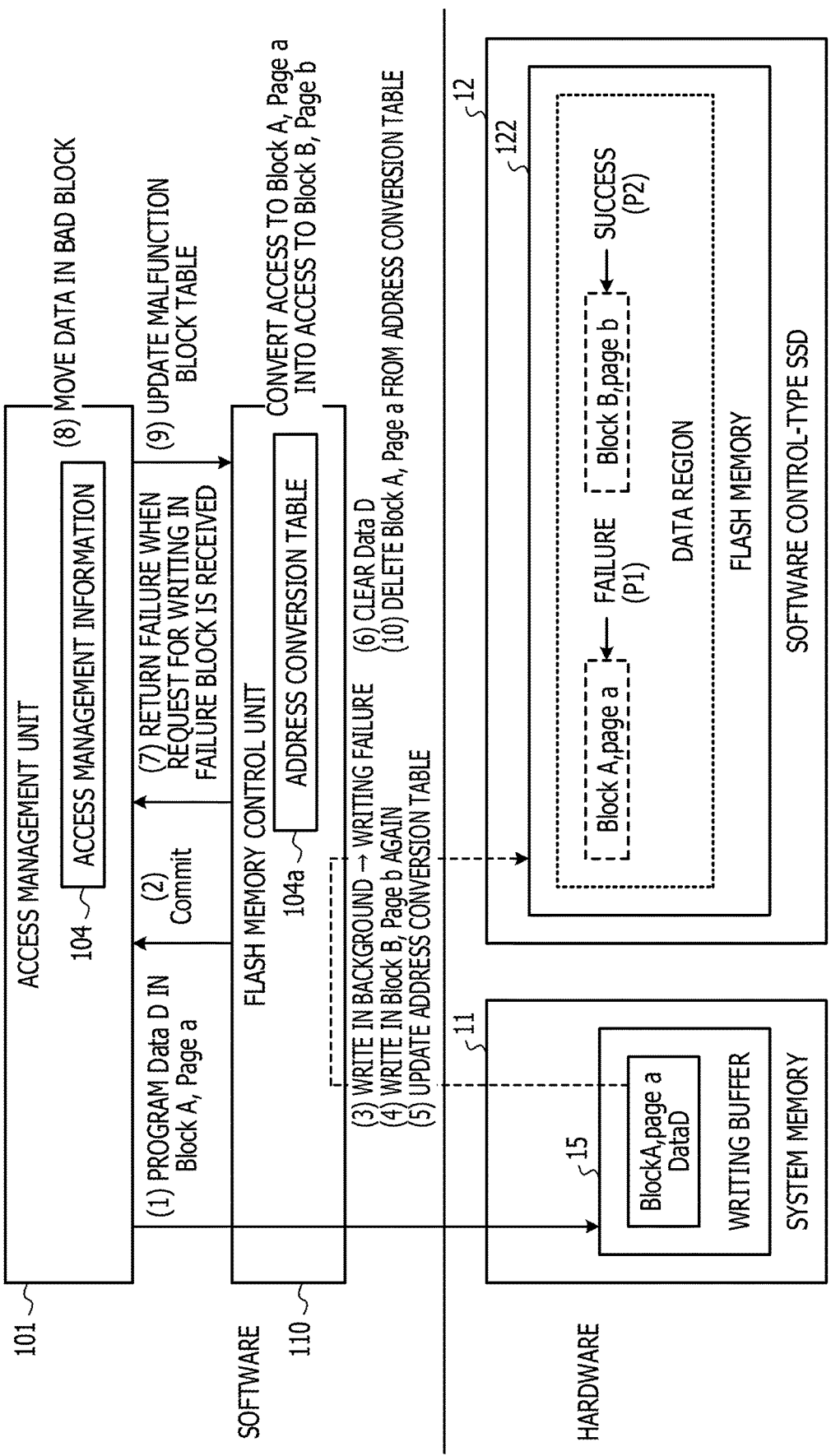
FIG. 7 is a diagram for explaining a writing (programming) process performed in a computer system in an example of a second embodiment.

FIG. 7 is a diagram for explaining a writing (programming) process performed in the computer system 1 in an example of the second embodiment.

Although in the computer system 1 according to the aforementioned first embodiment, the access management unit 101 realizes the management of the access management information 104 (address conversion table 104a) by the CPU 10 executing the flash memory control program, the embodiment is not limited thereto.

In the second embodiment, the SSD 12 includes the address conversion table 104a, and the bad storage region and the alternative storage region are registered in the address conversion table 104a by the SSD 12 when it is difficult to execute writing (programming) of the data in the designated region in the SSD 12 and a data access to the bad storage region occurs.

When the data in the SSD 12 is accessed, the address conversion table 104*a* included in the SSD 12 is referred, and an access to the data in the alternative storage region is performed instead of the access to the data in the bad storage region.

In the second embodiment, the flash memory control unit 110 has a function of checking, at the time of the programming, if the block as the destination of the programming is a block on which execution of the programming has previously been failed. Therefore, it is desirable for the flash memory control unit 110 to manage a history of the failure of the execution of the programming as history information for each block in the SSD 12. The flash memory control unit 110 manages a bad block, for example.

The flash memory control unit 110 responds to the access management unit 101 with "program failure" instead of responding to it with a commit, in response to the programming request issued for the block (bad block) on which the programming has previously been failed.

Note that the other parts are configured similarly to those in the computer system 1 according to the first embodiment.

(B) Operations

Figure 8:
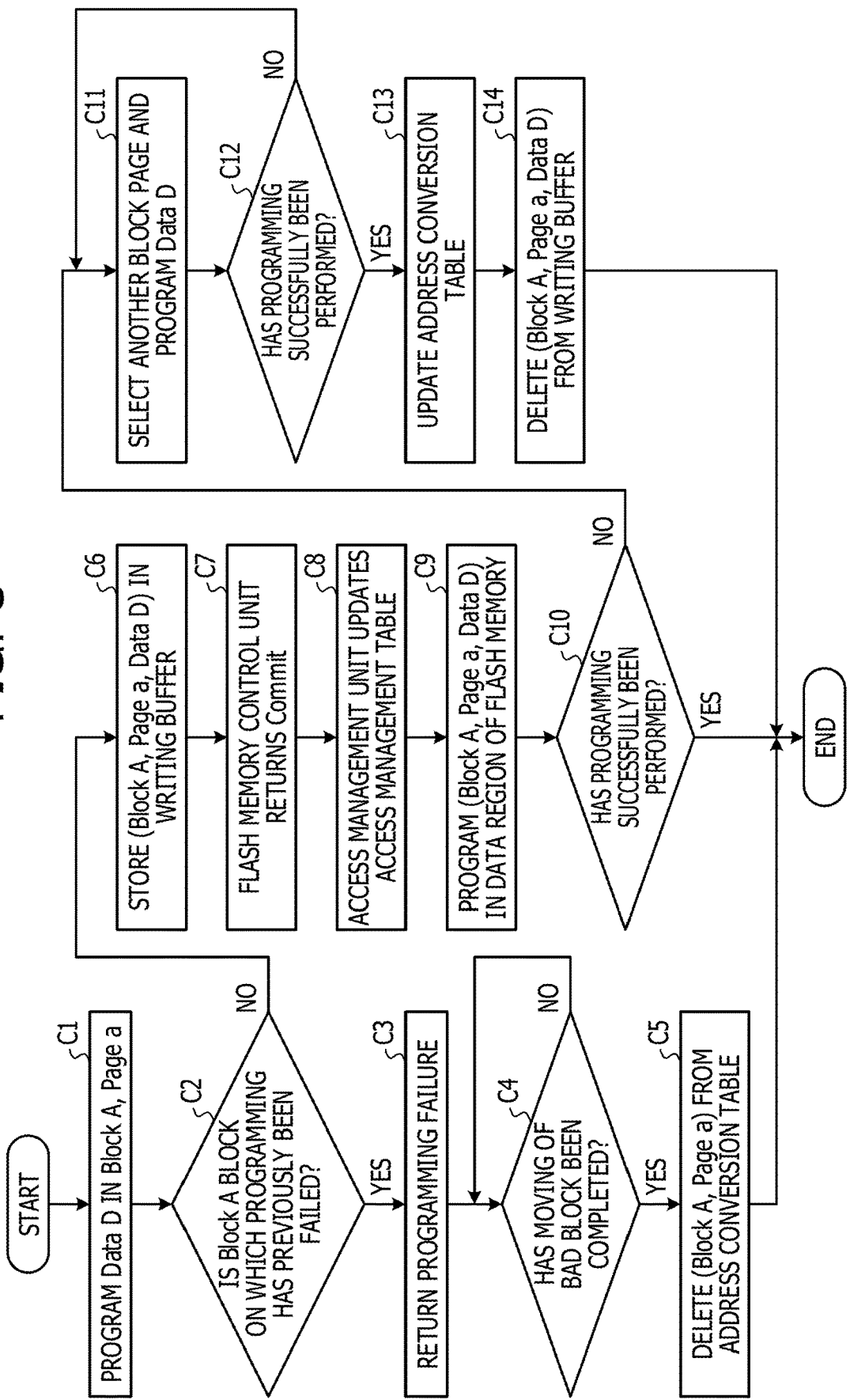
FIG. 8 is a flowchart for explaining a writing (programming) process performed in the computer system in an example of the second embodiment.

A writing (programming) process performed in the computer system 1 in one example of the second embodiment will be described based on the flowchart (Steps C1 to C14) illustrated in FIG. 8 with reference to FIG. 7.

In the example described below, an example in which an operation of programming data "D" (data D) in the storage region "Block A, page a" is assumed to have been issued from an application executed by the CPU 10, for example, will be described.

In Step C1, an operation of programming the data "D" (data D) in the storage region "Block A, page a" is issued.

In Step C2, the flash memory control unit 110 checks whether or not the block (Block A) as a destination of the programming issued in Step C1 is a block on which execution of the programming has previously been failed. For example, the flash memory control unit 110 checks whether or not the block as a target of the programming (Block A) is a bad block.

When the operation is not the operation of performing programming on the block on which the execution of the programming has previously been failed as a result of the checking in Step C2 (see the NO route from Step C2), the process proceeds to Step C6.

In Step C6, the access management unit 101 causes the writing buffer 15 in the system memory 11 to store the programming operation "Block A, page a, data D" (see the arrow (1) in FIG. 7).

In Step C7, the flash memory control unit 110 responds to the access management unit 101 with a commit (see the arrow (2) in FIG. 7).

In Step C8, the access management unit 101 updates the access management information (access management table) 104. For example, the access management unit 101 registers, in the access management information 104, information indicating that the data "D" (data D) has been programmed in the storage region "Block A, page a" in the SSD 12.

In Step C9, the flash memory control unit 110 programs the data "D" (data D) in the storage region "Block A, page a" in the flash memory 122 of the SSD 12 in the background.

In Step C10, the flash memory control unit 110 checks whether or not the programming performed in Step C9 has been successfully performed. When the programming has been successfully performed as a result of the checking (see the YES route from Step C10), the process is ended.

When the programming performed in Step C9 has been failed (see the NO route from Step C10), the process proceeds to Step C11 (see the arrow (3) and (P1) in FIG. 7).

In Step C11, the flash memory control unit 110 selects a page (alternative storage region: a storage region "Block B, page b" in the example) in another block (alternative block) that is different from the block (bad block) on which the programming has been failed (see the arrow P2 in FIG. 7). The flash memory control unit 110 programs the data "D" in the alternative storage region.

In Step C12, the flash memory control unit 110 checks whether or not the programming performed in Step C11 has successfully been performed. When the programming has been failed as a result of the checking (see the NO route from Step C12), the process returns to Step C11, and the selection of an alternative storage region and the programming of the data "D" are executed (see the arrow (4) in FIG. 7).

When the programming performed in Step C11 has successfully been performed (see the YES route in Step C12), the process proceeds to Step C13.

In Step C13, the flash memory control unit 110 updates the address conversion table 104*a*. That is, the flash memory control unit 110 registers Block A as a bad block and registers Block B as an alternative block in association with Block A in the address conversion table 104*a* (see the arrow (5) in FIG. 7).

In Step C14, the flash memory control unit 110 deletes (clears) the programming operation "Block A, page a, data D" in the writing buffer 15 (see the arrow (6) in FIG. 7) and ends the process.

When the operation is the operation of performing programming on the block on which the execution of the programming has previously been failed as a result of the checking in Step C2 (see the YES route from Step C2), the process proceeds to Step C3.

In Step C3, the flash memory control unit 110 responds to the access management unit 101 with a "programming failure" instead of a commit (see the arrow (7) in FIG. 7).

In Step C4, whether or not moving of effective data performed by the bad block data management unit 102 has been completed for the block that has been determined to be a bad block in Step C2 is checked. For example, whether or not a process of the bad block data management unit 102 moving data (effective data) stored in a page other than the bad page in the bad block to another block (normal block), from which no abnormality has been detected, has been completed is checked.

When the moving of the effective data has not been completed by the bad block data management unit 102 as a result of the checking (see the NO route from Step C4), the process returns to Step C4, and Step C4 is repeatedly performed until the moving of the effective data is completed.

The bad block data management unit 102 completes the process of moving the data (effective data) stored in the page other than the bad page in the bad block to another block (normal block) from which no abnormality has been detected (see the arrow (8) in FIG. 7).

When the moving of the effective has been completed by the bad block data management unit 102 (see the YES route from Step C4), the process moves to Step C5.

In Step C5, the access management unit 101 provides an instruction for updating the address conversion table 104*a* to the flash memory control unit 110 (see the arrow (9) in FIG. 7). The flash memory control unit 110 updates the address conversion table 104a by deleting "Block A, page a" that is the bad storage region from the address conversion table 104a (see the arrow (10) in FIG. 7) and ends the process.

Figure 9:
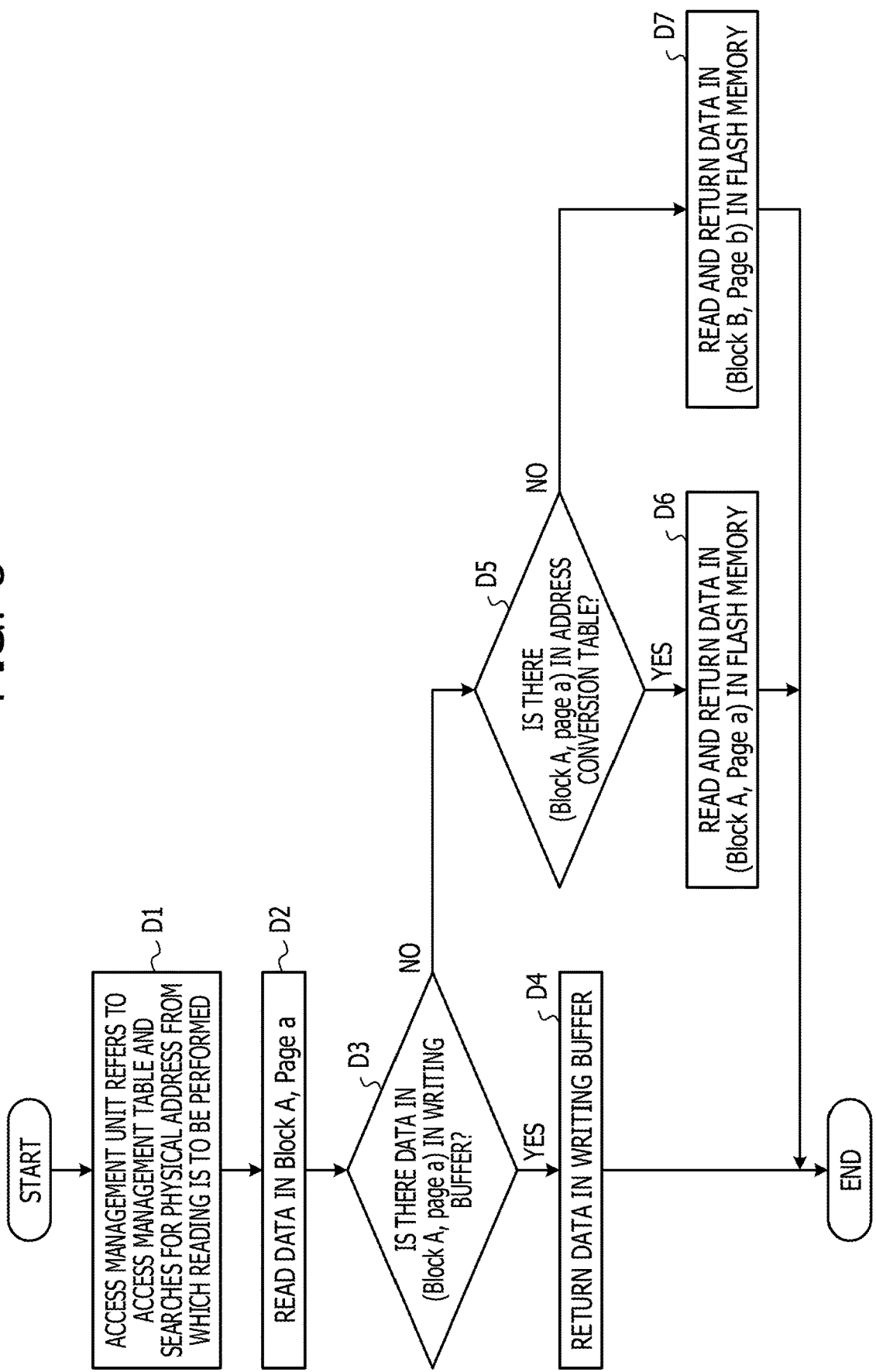
FIG. 9 is a flowchart for explaining a reading (read) process performed in the computer system in an example of the second embodiment.
Figure 10:
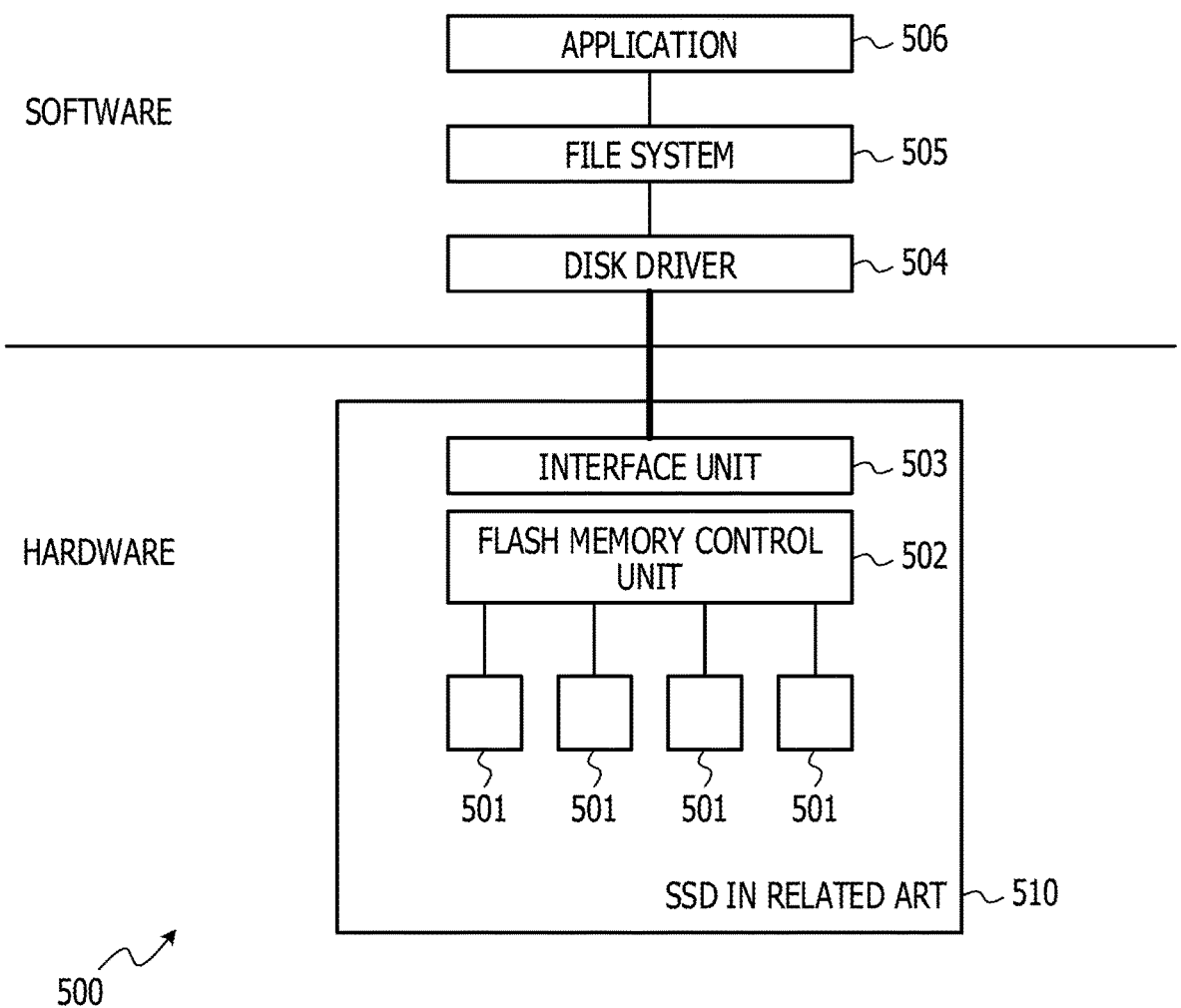
FIG. 10 is a diagram schematically illustrating functional configurations for controlling an SSD.
Figure 11:
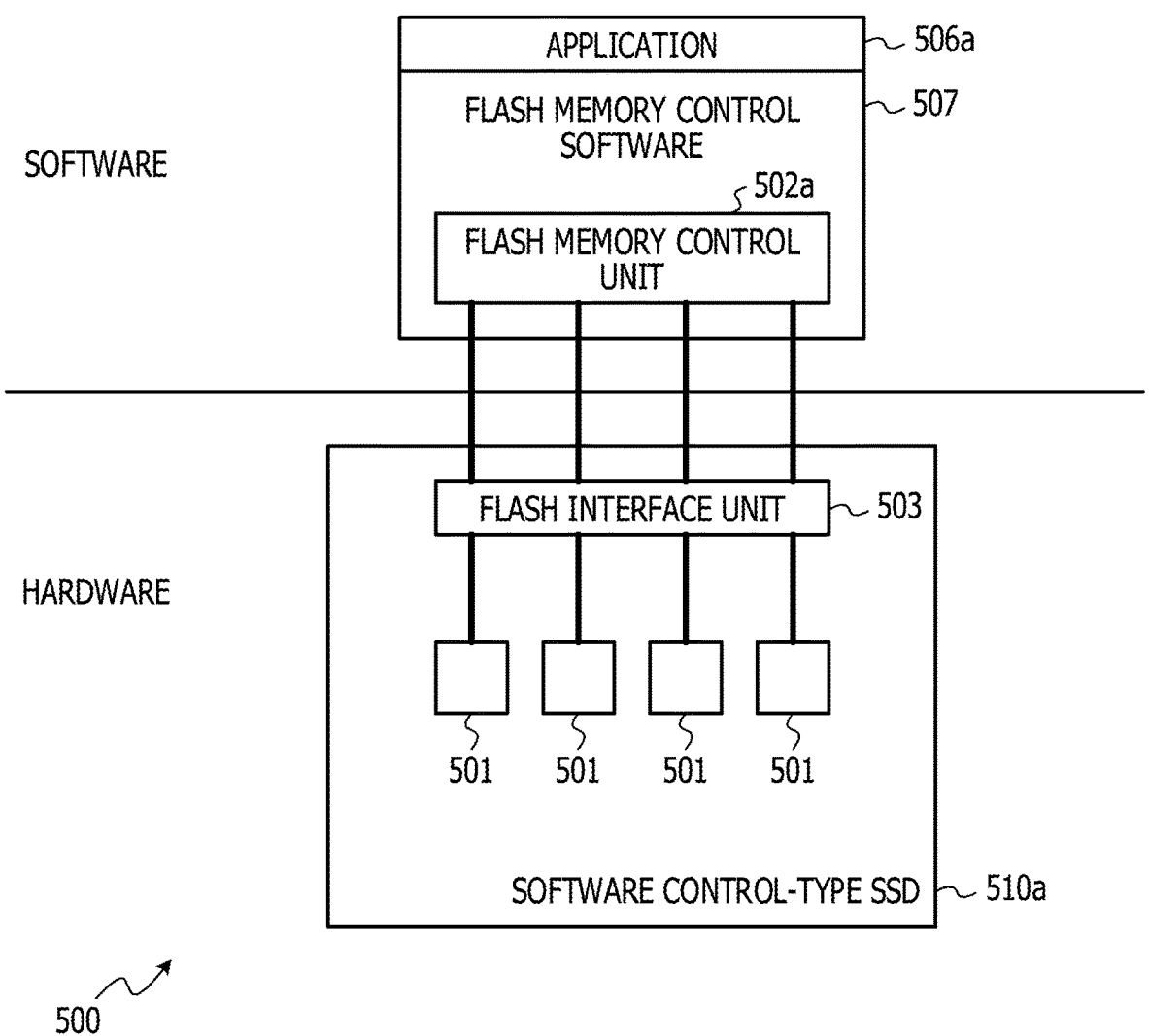
FIG. 11 is a diagram illustrating a configuration of a software control-type SSD.

Next, a reading (read) process performed in the computer system 1 in one example of the second embodiment will be described based on the flowchart (Step D1 to D7) illustrated in FIG. 9.

In the example described below, an example in which an operation of reading data in a storage region "Block A, page a" is assumed to have been issued from an application executed by the CPU 10, for example, will be described.

In Step D1, the access management unit 101 refers to the access management information 104 and searches for a physical address from which reading is performed.

In Step D2, the access management unit 101 executes reading of data in "Block A, page a".

In Step D3, the flash memory control unit 110 checks whether or not the data in "Block A, page a" that is a target region of the reading is stored in the writing buffer 15. When the data in "Block A, page a" is stored in the writing buffer 15 as a result of the checking (see the YES route from Step D3), the process proceeds to Step D4.

In Step D4, the flash memory control unit 110 reads the data in "Block A, page a" stored in the writing buffer 15, responds to the access management unit 101, and ends the process.

When the data in "Block A, page a" that is a target region of the reading is not stored in the writing buffer 15 as a result of the checking in Step D3 (see the NO route from Step D3), the process proceeds to Step D5.

In Step D5, the flash memory control unit 110 checks whether or not "Block A, page a" that is the target region of the reading is registered in the address conversion table 104a.

When "Block A, page a" that is the target region of the reading is registered in the address conversion table 104a as a result of the checking (see the YES route from Step D5), the target region of the reading is considered to be a bad block.

Thus, in Step D7, the flash memory control unit 110 acquires an alternative storage region "Block B, page b" corresponding to "Block A, page a" in the address conversion table 104a. The flash memory control unit 110 reads data in the storage region "Block B, page b" in the flash memory 122 of the SSD 12, responds to the access management unit 101, and ends the process.

When "Block A, page a" that is the target region of the reading is not registered in the address conversion table 104a as a result of the checking in Step D5 (see the NO route from Step D5), the target region of the reading is considered not to be a bad block.

Thus, in Step D6, the flash memory control unit 110 reads data in the storage region "Block A, page a" in the flash memory 122 of the SSD 12, responds to the access management unit 101, and ends the process.

(C) Effects

According to the computer system 1 in the second embodiment, advantages and effects that are similar to those of the first embodiment are obtained.

According to the second embodiment, the flash memory control unit 110 may not provide a notification regarding the bad storage region and the alternative storage region to the access management unit 101 after the selection of the alternative region is performed. An interface for providing such a notification regarding a change in addresses may not be additionally provided, and it is possible to realize the embodiment with less change in software in the existing system.

(III) Others

The disclosed technologies are not limited to the aforementioned embodiments and may be modified and performed in various manners without departing from the gist of the embodiments. The respective configurations and the respective processes in the embodiments may be appropriately omitted or selected if desired or may appropriately be combined.

For example, although the flash memory control unit 110 includes and manages the address conversion table 104a in the aforementioned second embodiment, the embodiments are not limited thereto. For example, the SSD 12 may include and manage the address conversion table 104a.

In the flash memory 122 of the SSD 12, a dedicated region (a region used at the time of a failure) that is used to provide an alternative storage region may be secured in advance separately from the data region on which writing of writing data is performed in response to a programming operation, and the alternative storage region may be selected and used from the region used at the time of a failure.

Those skilled in the art may perform and manufacture the embodiments in accordance with the above disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. An information processing apparatus comprising:
a first memory including a semiconductor device memory;
a second memory including a cache memory, the second memory being configured to temporarily store writing data to be written in the semiconductor device memory; and
a processor configured to execute an access control process that controls an access to a storage region of the semiconductor device memory,
the access control process includes:
  executing a writing-back process that includes providing a notification regarding completion of writing of the writing data before the writing data stored in the second memory is written in the first memory, the notification including a first physical address in the first memory, the first physical address being a physical address indicating a physical region of the first memory in which the writing of the writing data is attempted;
  executing an alternative writing process in response to detecting that the writing of the writing data at the first physical address in the first memory is failed, the alternative writing process including
    writing the writing data at a second physical address in the first memory, and storing a first correspondence into address management information, the first correspondence being a correspondence between the notified first physical address and the second physical address; and executing an access process in response to detecting of a first access request including the notified first physical address, the access process including converting the notified first physical address included in the access request into the second physical address by using the address management information, and obtaining the writing data by issuing a second access request to the first memory, the second access request including the converted second physical address.

2. The information processing apparatus according to claim 1, wherein the access control process is configured to execute a moving process that includes moving data in a block that includes the first physical address, at which the writing of the writing data has been failed, to another block that is different from the block.

3. The information processing apparatus according to claim 2, wherein the access control process is configured to execute a deletion process that includes deleting the writing data from the second memory after the moving of the data through the moving process is completed.

4. An information processing method, performed by a computer that includes a first memory and a second memory, the first memory including a semiconductor device memory, the second memory including a cache memory, the second memory being configured to temporarily store writing data to be written in the semiconductor device memory, the information processing method comprising:

executing a writing-back process that includes providing a notification regarding completion of writing of the writing data before the writing data stored in the second memory is written in the first memory, the notification including a first physical address in the first memory, the first physical address being a physical address indicating a physical region of the first memory in which the writing of the writing data is attempted;

executing an alternative writing process in response to detecting that the writing of the writing data at the first physical address in the first memory is failed, the alternative writing process including writing the writing data at a second physical address in the first memory, and storing a first correspondence into address management information, the first correspondence being a correspondence between the notified first physical address and the second physical address; and executing an access process in response to detecting of a first access request including the notified first physical address, the access process including converting the notified first physical address included in the access request into the second physical address by using the address management information, and obtaining the writing data by issuing a second access request to the first memory, the second access request including the converted second physical address.

5. The information processing method according to claim 4, further comprising: executing a moving process that includes moving data in a block that includes the first physical address, at which the writing of the writing data has been failed, to another block that is different from the block.

6. The information processing method according to claim 5, further comprising: executing a deletion process that includes deleting the writing data from the second memory after the moving of the data through the moving process is completed.

7. A non-transitory computer-readable storage medium for storing a program which causes a computer to perform processing, the computer including a first memory and a second memory, the first memory including a semiconductor device memory, the second memory including a cache memory, the second memory being configured to temporarily store writing data to be written in the semiconductor device memory, the processing comprising:

executing a writing-back process that includes providing a notification regarding completion of writing of the writing data before the writing data stored in the second memory is written in the first memory, the notification including a first physical address in the first memory, the first physical address being a physical address indicating a physical region of the first memory in which the writing of the writing data is attempted;

executing an alternative writing process in response to detecting that the writing of the writing data at the first physical address in the first memory is failed, the alternative writing process including writing the writing data at a second physical address in the first memory, and storing a first correspondence into address management information, the first correspondence being a correspondence between the notified first physical address and the second physical address; and executing an access process in response to detecting of a first access request including the notified first physical address, the access process including converting the notified first physical address included in the access request into the second physical address by using the address management information, and obtaining the writing data by issuing a second access request to the first memory, the second access request including the converted second physical address.

8. The non-transitory computer-readable storage medium according to claim 7, the processing further comprising: executing a moving process that includes moving data in a block that includes the first physical address, at which the writing of the writing data has been failed, to another block that is different from the block.

9. The non-transitory computer-readable storage medium according to claim 8, the processing further comprising: executing a deletion process that includes deleting the writing data from the second memory after the moving of the data through the moving process is completed.

* * * * *